United States Patent
Zarabadi et al.

(10) Patent No.: US 12,054,073 B2
(45) Date of Patent: Aug. 6, 2024

(54) SYSTEM AND METHOD FOR HIGH VOLTAGE BATTERY PACK MEASUREMENT

(71) Applicant: DELPHI TECHNOLOGIES IP LIMITED, St. Michael (BB)

(72) Inventors: Seyed R. Zarabadi, Kokomo, IN (US); Mark R. Keyse, Sharpsville, IN (US); Mark W. Gose, Kokomo, IN (US)

(73) Assignee: Delphi Technologies IP Limited, St. Michael (BB)

( * ) Notice: Subject to any disclaimer, the term of this patent is extended or adjusted under 35 U.S.C. 154(b) by 697 days.

(21) Appl. No.: 17/333,854

(22) Filed: May 28, 2021

(65) Prior Publication Data
US 2022/0379771 A1    Dec. 1, 2022

(51) Int. Cl.
*B60L 58/12*      (2019.01)
*G01R 31/36*      (2020.01)
*G01R 31/388*     (2019.01)

(52) U.S. Cl.
CPC .......... *B60L 58/12* (2019.02); *G01R 31/3648* (2013.01); *G01R 31/388* (2019.01)

(58) Field of Classification Search
CPC ... B60L 58/12; G01R 31/388; G01R 31/3648; H01M 10/48; H01M 10/482; H01M 10/4257; H01M 50/572; H01M 2010/4271
See application file for complete search history.

(56) References Cited

U.S. PATENT DOCUMENTS

| | | | |
|---|---|---|---|
| 7,723,993 | B2 | 5/2010 | Klang |
| 10,371,758 | B2 | 8/2019 | Fadel et al. |
| 10,466,307 | B2 | 11/2019 | Jeon |
| 2003/0030440 | A1 | 2/2003 | Yugou |
| 2007/0090804 | A1 | 4/2007 | Kim et al. |
| 2013/0151175 | A1 | 6/2013 | Streit |
| 2014/0035594 | A1 | 2/2014 | Kamata et al. |
| 2016/0190658 | A1* | 6/2016 | Ishibashi ............... H02J 7/0048 324/432 |

FOREIGN PATENT DOCUMENTS

KR    1020120127802 A    11/2012

OTHER PUBLICATIONS

Extended European search report in EP application 22 173 825.5, dated Sep. 28, 2022 (12 pages).

* cited by examiner

*Primary Examiner* — Christopher P Domone
(74) *Attorney, Agent, or Firm* — Joshua M. Haines; Bookoff McAndrews, PLLC

(57) ABSTRACT

An apparatus includes a first analog-to-digital converter configured to measure a first reference voltage and a third reference voltage. The apparatus also includes a second analog-to-digital converter configured to measure a second reference voltage and a fourth reference voltage. The apparatus also includes a controller configured to calculate a first resistance ratio, and determine a positive high voltage associated with the positive high voltage direct current input signal based, at least in part, on the first resistance ratio. The controller is further configured to calculate a second resistance ratio, and determine a negative high voltage associated with the negative high voltage direct current input signal based, at least in part, on the second resistance ratio.

20 Claims, 8 Drawing Sheets

SYSTEM AND METHOD FOR HIGH VOLTAGE BATTERY PACK MEASUREMENT

TECHNICAL FIELD

This disclosure relates to vehicle battery packs, and in particular, to systems and methods for high voltage battery pack measurement.

BACKGROUND

Vehicles, such as cars, trucks, sport utility vehicles, crossovers, mini-vans, or other suitable vehicles, are increasingly including one or more battery packs configured to assist in vehicle propulsion and/or other aspects of vehicle operation. For example, high energy prices and the growing concerns over carbon emissions have directed vehicle manufacturers toward the development of electric and hybrid electric vehicles. Li-ion battery packs are the key components of such vehicles.

Typically, such vehicles include a high voltage battery pack to provide power to multiple high-voltage powertrain subsystems, such as traction inverter and motor control systems for driving 3-phase traction motor (e.g., by converting a high voltage direct current (DC) battery to multi-phase alternating current (AC) signal, an on-board charger (e.g., which charges the high voltage DC battery by converting an AC line voltage to DC), battery management systems (e.g., that monitor, control, and protect the charging and discharging of the high voltage DC battery), and the like. Accordingly, accurate knowledge of the high voltage battery pack is essential to safely operating (e.g., achieving most energy output for the longest possible lifetime) of the high voltage battery pack.

SUMMARY

This disclosure relates generally to high voltage battery pack measurement systems and methods.

An aspect of the disclosed embodiments includes a method for measuring voltage of a high voltage battery pack. The method includes, during one of a system power up period and a system wake-up period: i) generating, for an electronic circuit associated with the high voltage battery pack, a first reference voltage associated with a positive high voltage direct current input signal and a second reference voltage associated with the positive high voltage direct current input signal and a third reference voltage associated with a negative high voltage direct current input signal and a fourth reference voltage associated with the negative high voltage direct current input signal; ii) measuring, for a predetermined number of iterations, the first reference voltage and the third reference voltage; iii) measuring, for the predetermined number of iterations, the second reference voltage and the fourth reference voltage; iv) calculating, for the electronic circuit associated with the high voltage battery pack, a first resistance ratio based, at least in part, on voltage measurements for each of the predetermined number of iterations of the first reference voltage and the third reference voltage; and v) calculating, for the electronic circuit associated with the high voltage battery, a second resistance ratio based, at least in part, on voltage measurements for each of the predetermined number of iterations of the second reference voltage and the fourth reference voltage. The method also includes, after the one of the system power up period and the system wake-up period: i) determining a positive high voltage associated with the positive high voltage direct current input signal based, at least in part, on the first resistance ratio; and ii) determining a negative high voltage associated with the negative high voltage direct current input signal based, at least in part, on the second resistance ratio.

Another aspect of the disclosed embodiments includes a system for measuring voltage of a high voltage battery pack. The system includes a first integrated circuit configured to receive a first reference voltage and a second reference voltage associated with a positive high voltage direct current input signal. The system also includes a second integrated circuit configured to receive a third reference voltage and a fourth reference voltage associated with a negative high voltage direct current input signal. The system also includes a first analog-to-digital converter in communication with the first integrated circuit, the first analog-to-digital converter being configured to measure, during one of a system power up period and a system wake-up period, the first reference voltage and the third reference voltage for a predetermined number of iterations. The system also includes a second analog-to-digital converter in communication with the second integrated circuit, the second analog-to-digital converter being configured to measure, during the one of the system power up period and the system wake-up period, the second reference voltage and the fourth reference voltage for the predetermined number of iterations. The system also includes a controller configured to calculate a first resistance ratio based, at least in part, on voltage measurements for each of the predetermined number of iterations of the first reference voltage and the third reference voltage and, after the one of the system power up period and the system wake-up period, determine a positive high voltage associated with the positive high voltage direct current input signal based, at least in part, on the first resistance ratio. The controller is further configured to calculate a second resistance ratio based, at least in part, on voltage measurements for each of the predetermined number of iterations of the second reference voltage and the fourth reference voltage, and after the one of the system power up period and the system wake-up period, determine a negative high voltage associated with the negative high voltage direct current input signal based, at least in part, on the second resistance ratio.

Another aspect of the disclosed embodiments includes an apparatus for measuring voltage of a high voltage battery pack. The apparatus includes a first analog-to-digital converter configured to measure, for a predetermined number of iterations, a first reference voltage associated with a positive high voltage direct current input signal and a third reference voltage associated with a negative high voltage direct current input signal. The apparatus also includes a second analog-to-digital converter configured to measure, for the predetermined number of iterations, a second reference voltage associated with the positive high voltage direct current input signal and a fourth reference voltage associated with the negative high voltage direct current input signal. The apparatus also includes a controller configured to calculate a first resistance ratio based, at least in part, on voltage measurements for each of the predetermined number of iterations of the first reference voltage and the third reference voltage, and determine a positive high voltage associated with the positive high voltage direct current input signal based, at least in part, on the first resistance ratio. The controller is further configured to calculate a second resistance ratio based, at least in part, on voltage measurements for each of the predetermined number of iterations of the second reference voltage and the fourth reference voltage, and determine a negative high voltage associated with the negative high voltage direct current input signal based, at least in part, on the second resistance ratio.

These and other aspects of the present disclosure are provided in the following detailed description of the embodiments, the appended claims, and the accompanying figures.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

The following discussion is directed to various embodiments of the present disclosure. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

As described, vehicles, such as cars, trucks, sport utility vehicles, cross-overs, mini-vans, or other suitable vehicles, are increasingly including one or more battery packs configured to assist in vehicle propulsion and/or other aspects of vehicle operation. For example, high energy prices and the growing concerns over carbon emissions have directed vehicle manufacturers toward the development of electric and hybrid electric vehicles. Li-ion battery packs are the key components of such vehicles.

Typically, such vehicles include a high voltage battery pack to provide power to multiple high-voltage powertrain subsystems, such as traction inverter and motor control systems for driving 3-phase traction motor (e.g., by converting a high voltage direct current (DC) battery to multi-phase alternating current (AC) signal, an on-board charger (e.g., which charges the high voltage DC battery by converting an AC line voltage to DC), battery management systems (e.g., that monitor, control, and protect the charging and discharging of the high voltage DC battery), and the like. Accurate knowledge of the high voltage battery pack is essential to safely operating (e.g., achieving most energy output for the longest possible lifetime) of the high voltage battery pack.

Figure 3A:
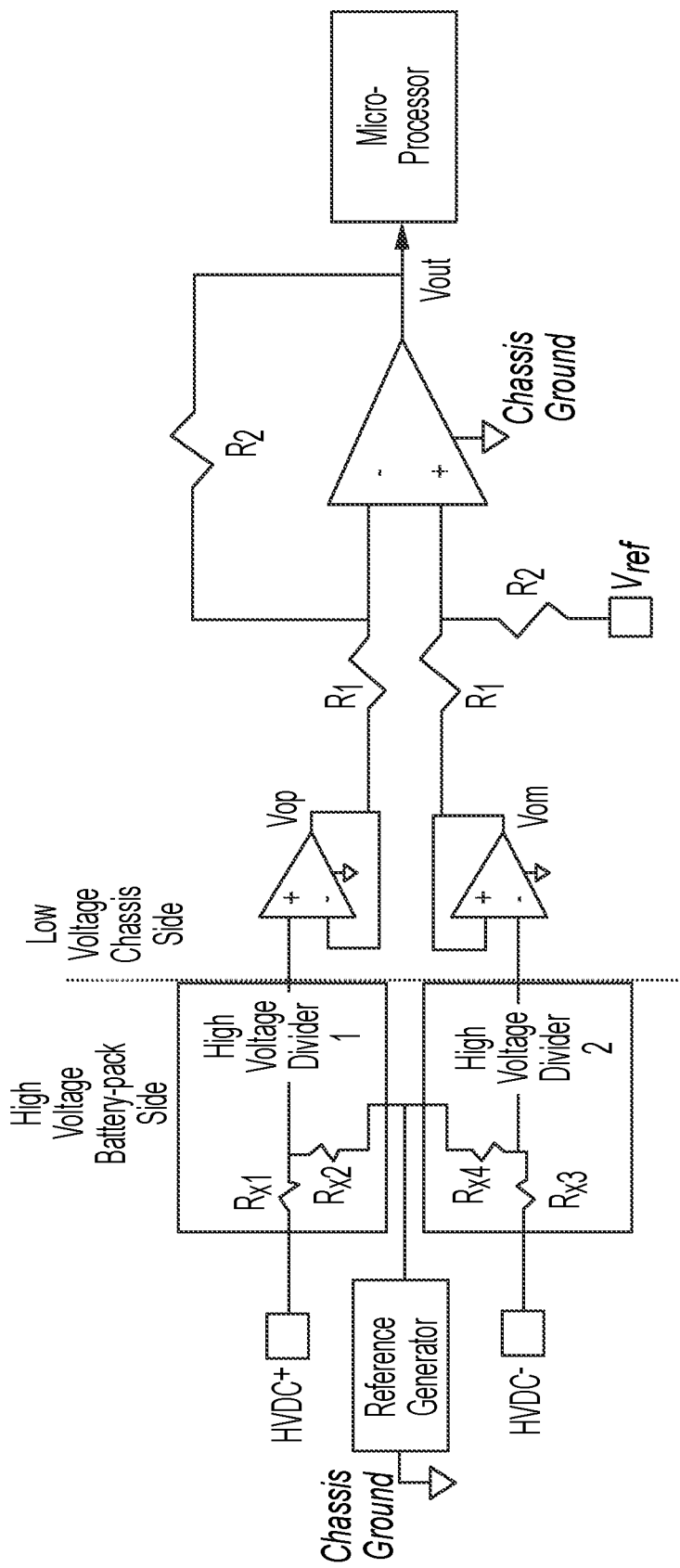
FIGS. 3A and 3B generally illustrate a high voltage battery pack voltage measurement system according to the prior art.
Figure 3B:
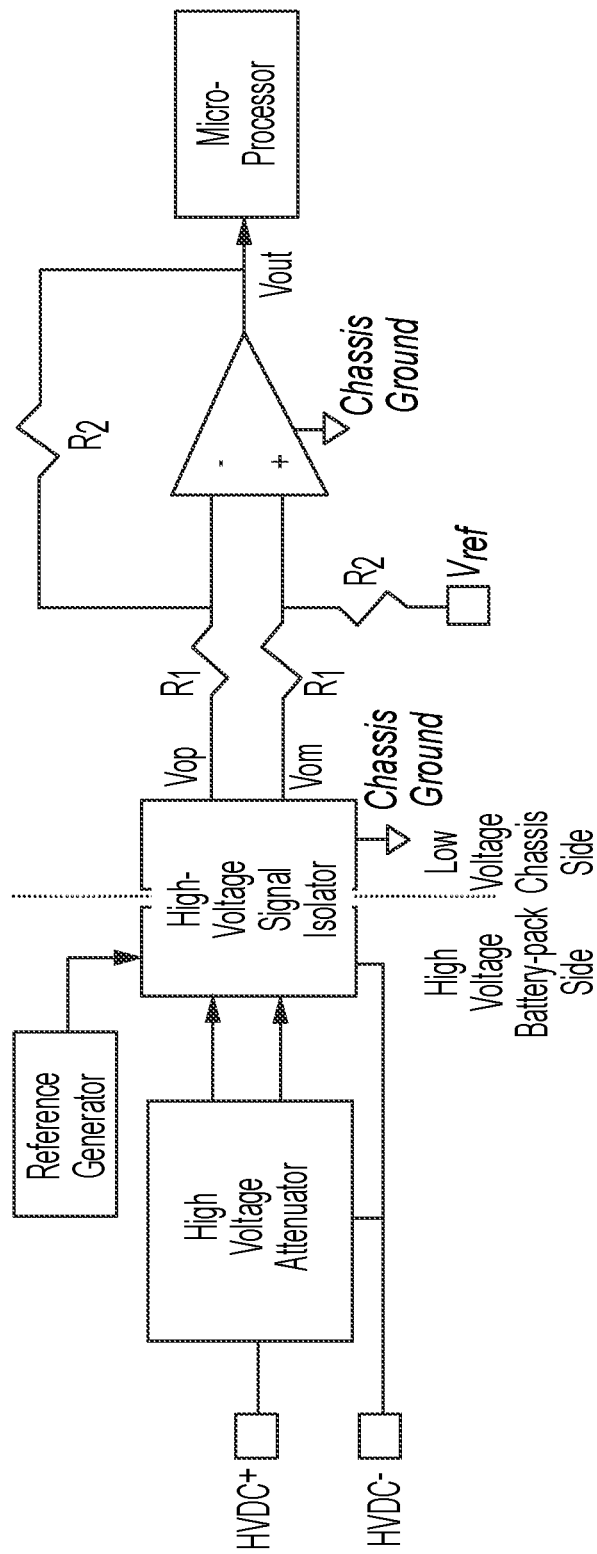

Typical solutions for providing high voltage battery pack voltage measurement are generally illustrated in FIGS. 3A and 3B. In FIG. 3A, a positive high voltage DC terminal (e.g., which may be referred to herein as a positive high voltage DC input signal) HVDC+ and a negative high voltage DC terminal (e.g., which may be referred to herein as a negative high voltage DC input signal) HVDC− are terminals of a high-voltage battery pack. A difference voltage between the HVDC+ and the HVDC− terminals may be relatively high (e.g., 1000 volts or other suitable value).

Typically, to measure the voltage of the high voltage battery pack, two groups of high voltage matched, precision resistors Rx1-Rx2 and Rx3-Rx4 are used in respective high voltage dividers (e.g., high voltage divider 1 and high voltage divider 2). Such resistors must remain stable throughout the life of the typical battery voltage measurement systems. An attenuated version of HVDC+ and HVDC− signals are first voltage buffered before feeding into a differential-to-single-ended conversion circuit, an output voltage of which is provided to a micro-processor unit.

Output voltages Vop and Vom represent the positive-to-chassis and the negative-to-chassis voltages, respectively. Output voltage Vout represents the difference between the battery terminal voltages. In such systems, the stability (e.g., having negligible voltage coefficient, temperature coefficient, value drift due to the ageing, and sensitivity to mechanical stress affecting the resistance values) and matching precision of both resistors is critical for an accurate voltage measurement of the battery pack voltages. However, well-matched and stable high-voltage resistors and two analog buffer circuits account for a significant cost of this high voltage measurement systems.

Another typical solution for a high-voltage battery pack measurement circuit is generally illustrate din FIG. 3B. For example, HVDC+ and HVDC−, battery terminal voltages, are first attenuated by a precision attenuator circuit having outputs that are provided as inputs into a precision high-voltage signal isolator block. The differential outputs, Vop and Vom, of the high voltage signal isolator are converted into a single out, Vout, using a precision differential-to-single ended converter circuit. In addition to requiring a precision attenuation and precision differential-to-single ended converter circuit (e.g., or circuits), such a system may also require a relatively high-cost precision high-voltage voltage isolator block. Long-term performance stability of all these circuit blocks are essential to accurately measure the high voltage battery voltage (e.g., including each terminal voltage of the battery pack) during the full operating life of the system, which translates to a higher overall system cost.

Accurate measurement of the battery pack voltage can be only guaranteed when the measurement process is not affected by drift or shift of the components, which normally occurs to some degrees, by the environmental effects and the aging of the components (e.g., of the measurements circuits).

Accordingly, systems and methods, such as those described herein, that provide accurate high voltage battery pack measurement, may be desirable. In some embodiments, the systems and the methods described herein may be configured to provide high voltage measurement having relatively high immunity to the shortcomings of measurement inaccuracy/errors of the prior art.

Figure 4A:
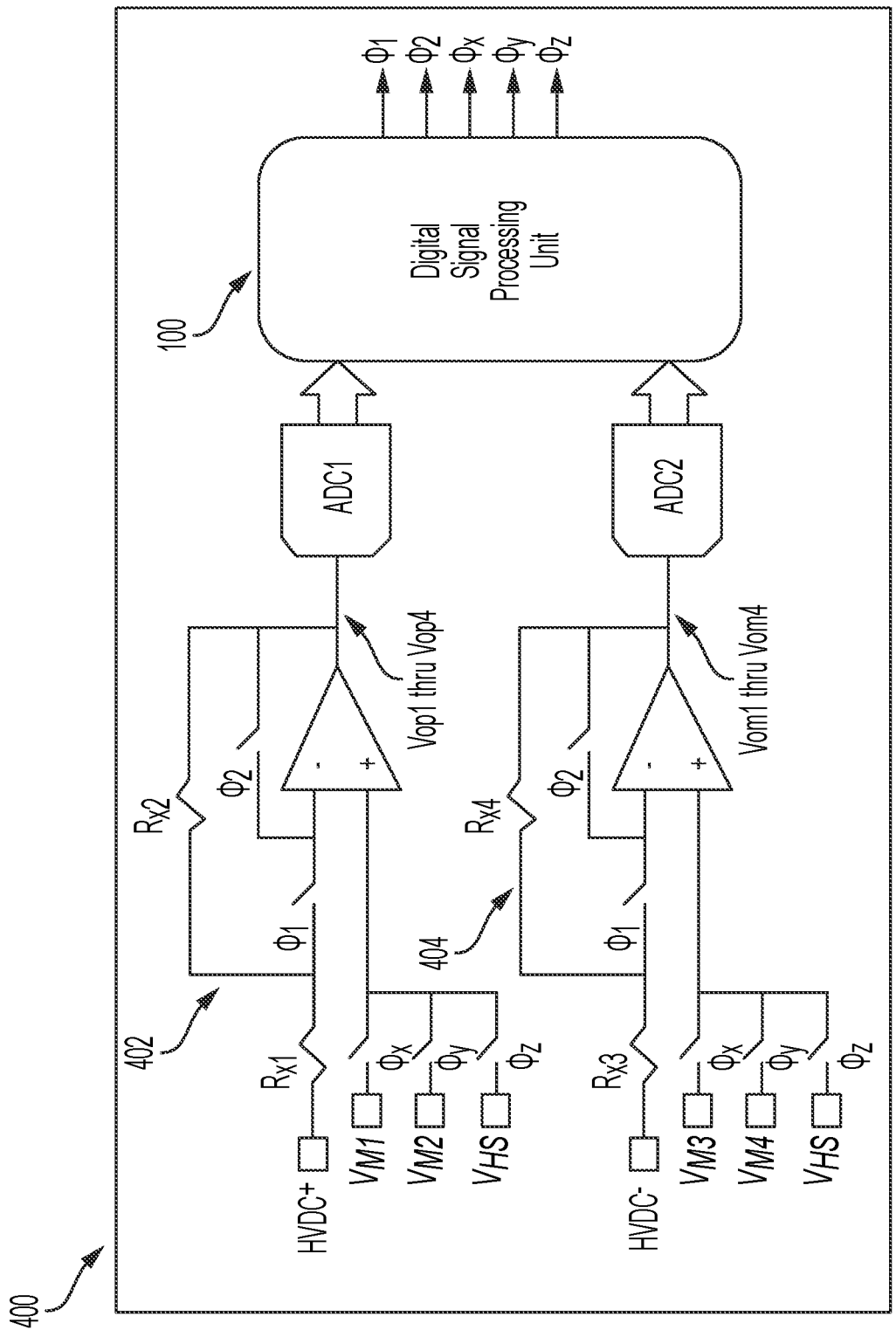
FIGS. 4A-4C generally illustrate a high voltage battery pack voltage measurement system according to the principles of the present disclosure.
Figure 4B:
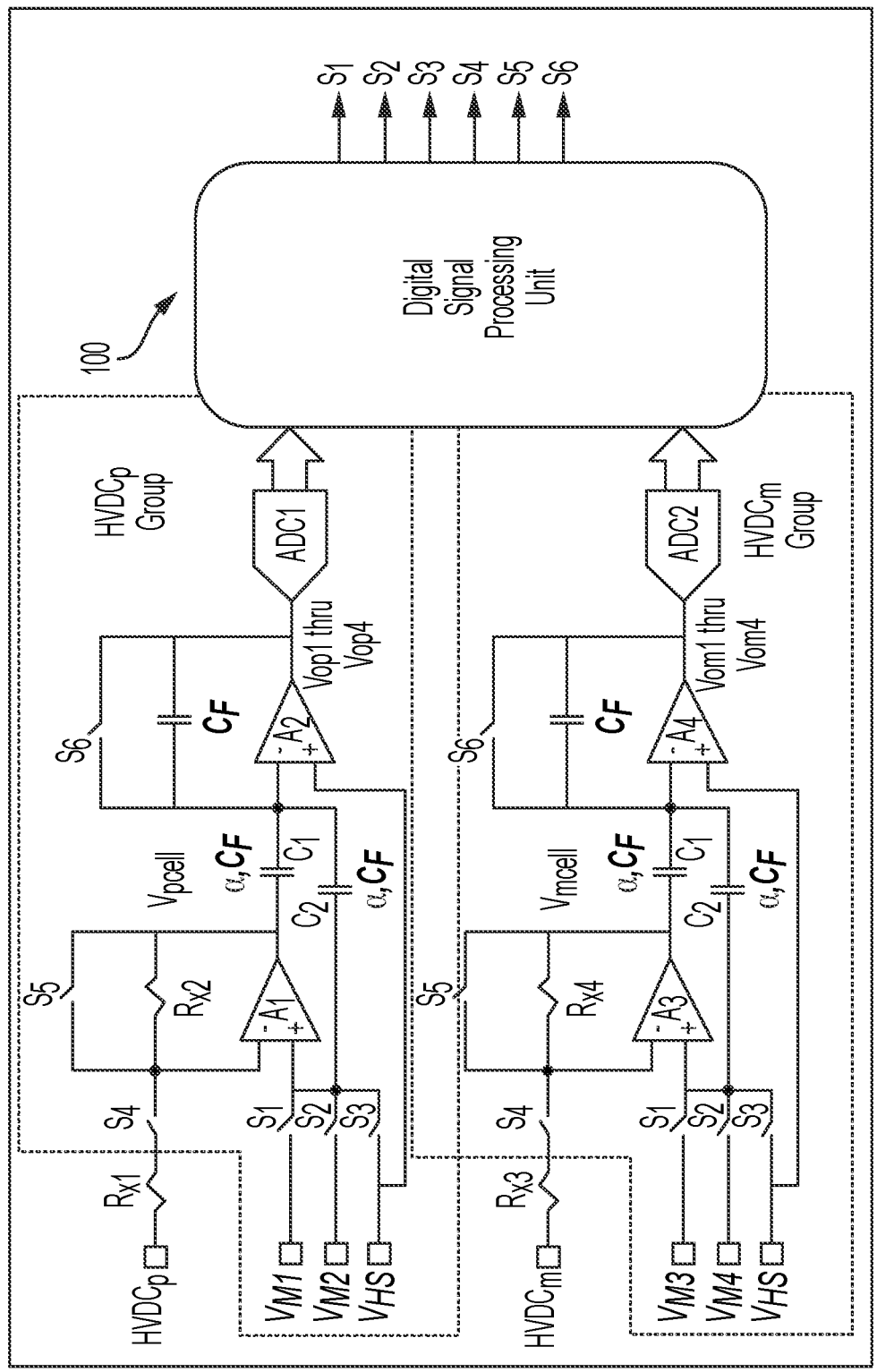
Figure 4C:
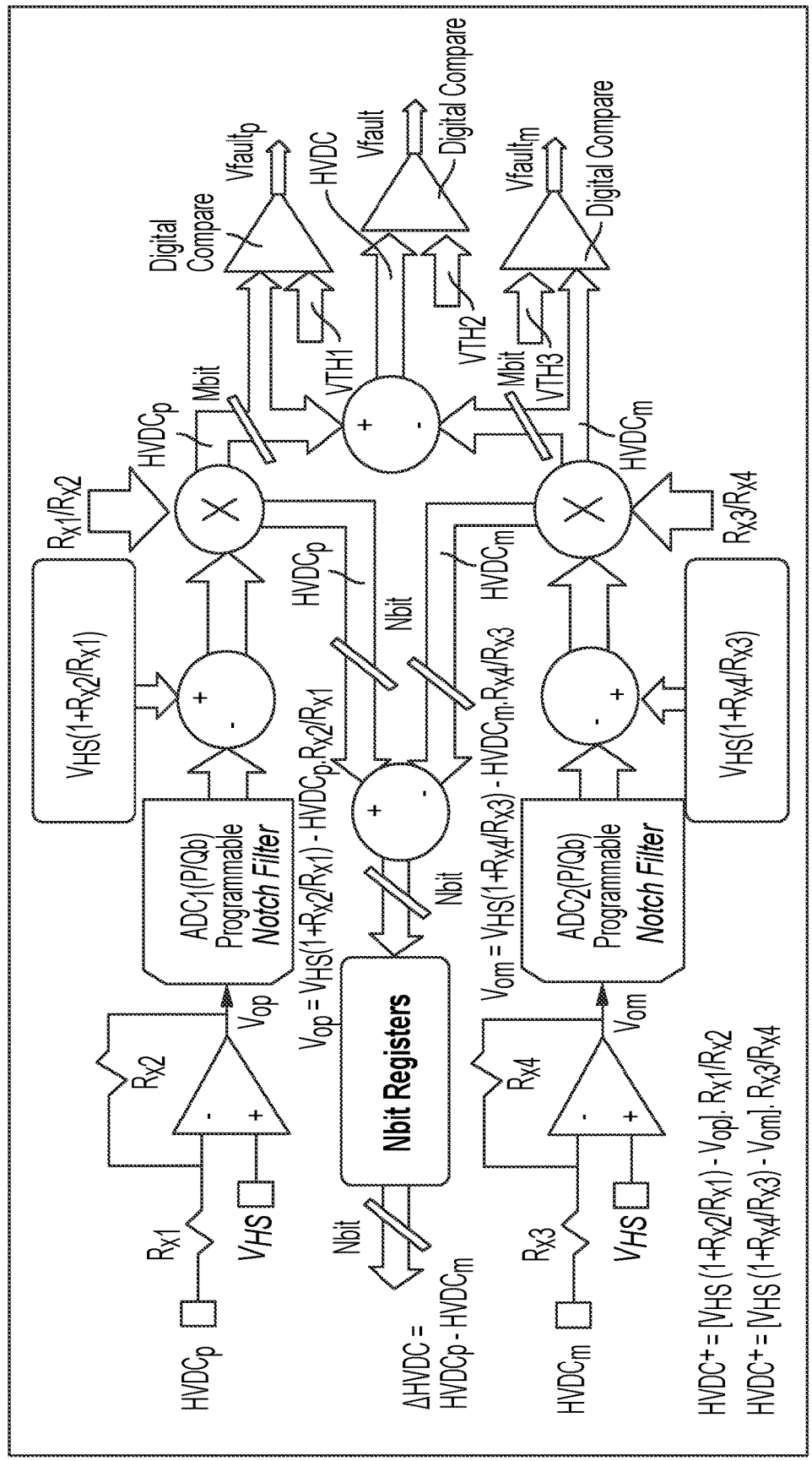

In some embodiments, and as is generally illustrated in FIGS. 4A-4C, the systems and methods described herein may be configured to provide a calibration step, which may occur during the system power-up period, a system wake-up period, or any other suitable time, including immediately or substantially immediately prior to measuring the high voltage battery pack terminal voltages. The systems and methods described herein may be configured to precisely measure resistor ratios of Rx2/Rx1 and Rx4/Rx3, regardless of the values of the high voltage battery pack terminal (e.g., the resistor ratios are measured for any static, slowly varying, and/or reasonably fast varying high voltage battery pack terminal voltages).

The systems and methods described herein may be configured to provide a measurement step to measure the high voltage battery pack terminal voltages using information generated during the calibration step (e.g., the determined resistor ratios). The systems and methods described herein may be configured to provide precision measurements of the high voltage battery pack terminal voltages having measured values that are not corrupted by any possible instability of component values due to the environmental effects, drifts, and/or ageing.

In some embodiments, the systems and methods described herein may be configured to measure voltages of a high voltage battery pack. The high voltage battery pack may be associated with operation of a vehicle, such as vehicle propulsion and the like. Alternatively, the high voltage battery pack may be associated with any suitable application other than operation of a vehicle. The systems and methods described herein may be configured to include a first integrated circuit configured to receive a first reference voltage and a second reference voltage associated with a positive high voltage direct current input signal. The systems and methods described herein may be configured to include a second integrated circuit configured to receive a third reference voltage and a fourth reference voltage associated with a negative high voltage direct current input signal.

The systems and methods described herein may be configured to include a first analog-to-digital converter in communication with the first integrated circuit. The first analog-to-digital converter may be configured to measure, during one of a system power up period and a system wake-up period, the first reference voltage and the third reference voltage for a predetermined number of iterations. The predetermined number of iterations may include four iterations or any suitable number of iterations. Measuring, for the predetermined number of iterations, the first reference voltage may include closing a switch corresponding to the positive high voltage direct current input signal and a switch corresponding to the first reference voltage. Measuring, for the predetermined number of iterations, the third reference voltage may include closing a switch corresponding to the negative high voltage direct current input signal and a switch corresponding to the third reference voltage.

The systems and methods described herein may be configured to include a second analog-to-digital converter in communication with the second integrated circuit. The second analog-to-digital converter may be configured to measure, during the one of the system power up period and the system wake-up period, the second reference voltage and the fourth reference voltage for the predetermined number of iterations. Measuring, for the predetermined number of iterations, the second reference voltage may include closing a switch corresponding to the positive high voltage direct current input signal and a switch corresponding to the second reference voltage. Measuring, for the predetermined number of iterations, the fourth reference voltage may include closing a switch corresponding to the negative high voltage direct current input signal and a switch corresponding to the fourth reference voltage.

In some embodiments, a controller may be configured to calculate a first resistance ratio based, at least in part, on voltage measurements for each of the predetermined number of iterations of the first reference voltage and the third reference voltage. The first resistance ratio may include a ratio of a resistance of the first integrated circuit and an external resistance of the first integrated circuit.

The controller may, after the one of the system power up period and the system wake-up period, determine a positive high voltage associated with the positive high voltage direct current input signal based, at least in part, on the first resistance ratio. Determining the positive high voltage associated with the positive high voltage direct current input signal may include closing a switch corresponding to the positive high voltage direct current input signal and a switch corresponding to a low voltage signal reference voltage associated with the positive high voltage direct current input signal.

In some embodiments, the controller may be further configured to calculate a second resistance ratio based, at least in part, on voltage measurements for each of the predetermined number of iterations of the second reference voltage and the fourth reference voltage. The second resistance ratio includes a ratio of a resistance of the second integrated circuit and an external resistance of the second integrated circuit.

The controller may, after one of the system power up period and the system wake-up period, determine a negative high voltage associated with the negative high voltage direct current input signal based, at least in part, on the second resistance ratio. Determining the negative high voltage associated with the negative high voltage direct current input signal may include closing a switch corresponding to the negative high voltage direct current input signal and a switch corresponding to a low voltage signal reference voltage associated with the negative high voltage direct current input signal.

Figure 1:
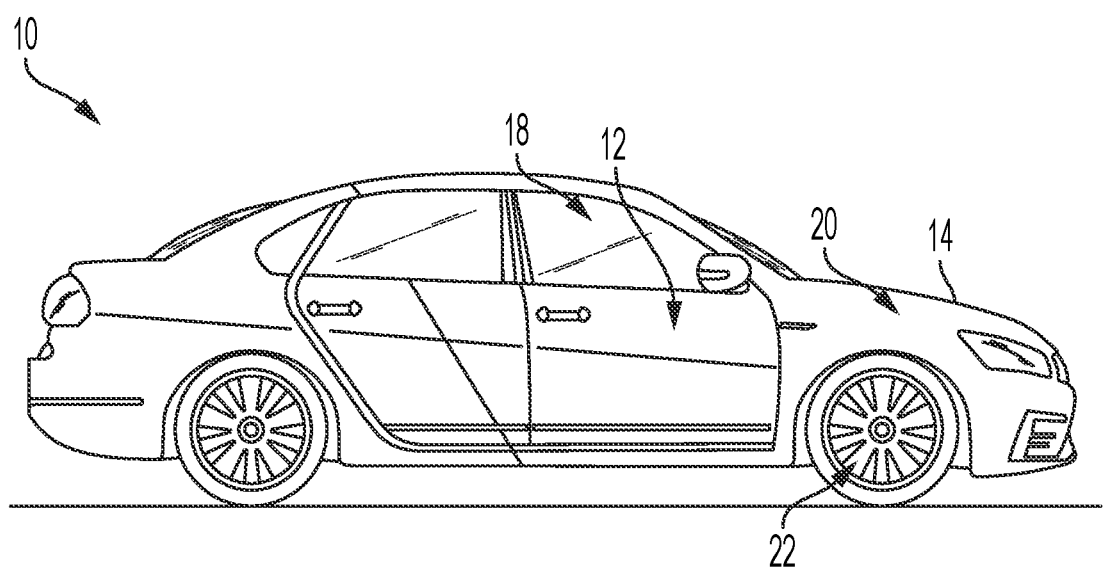
FIG. 1 generally illustrates a vehicle according to the principles of the present disclosure.

FIG. 1 generally illustrates a vehicle 10 according to the principles of the present disclosure. The vehicle 10 may include any suitable vehicle, such as a car, a truck, a sport utility vehicle, a mini-van, a cross-over, any other passenger vehicle, any suitable commercial vehicle, or any other suitable vehicle. While the vehicle 10 is illustrated as a passenger vehicle having wheels and for use on roads, the principles of the present disclosure may apply to other vehicles, such as planes, boats, trains, drones, or other suitable vehicles. The vehicle 10 includes a vehicle body 12 and a hood 14. A portion of the vehicle body 12 defines a passenger compartment 18. Another portion of the vehicle body 12 defines the engine compartment 20. The hood 14 may be moveably attached to a portion of the vehicle body 12, such that the hood 14 provides access to the engine compartment 20 when the hood 14 is in a first or open position and the hood 14 covers the engine compartment 20 when the hood 14 is in a second or closed position.

The passenger compartment 18 is disposed rearward of the engine compartment 20. The vehicle 10 may include any suitable propulsion system including an internal combustion engine, one or more electric motors (e.g., an electric vehicle), one or more fuel cells, a hybrid (e.g., a hybrid vehicle) propulsion system comprising a combination of an internal combustion engine, one or more electric motors, and/or any other suitable propulsion system. In some embodiments, the vehicle 10 may include a petrol or gasoline fuel engine, such as a spark ignition engine. In some embodiments, the vehicle 10 may include a diesel fuel engine, such as a compression ignition engine. The engine compartment 20 houses and/or encloses at least some components of the propulsion system of the vehicle 10. Additionally, or alternatively, propulsion controls, such as an accelerator actuator (e.g., an accelerator pedal), a brake actuator (e.g., a brake pedal), a steering wheel, and other such components are disposed in the passenger compartment 18 of the vehicle 10. The propulsion controls may be actuated or controlled by a driver of the vehicle 10 and may be directly connected to corresponding components of the propulsion system, such as a throttle, a brake, a vehicle axle, a vehicle transmission, and the like, respectively. In some embodiments, the propulsion controls may communicate signals to a vehicle computer (e.g., drive by wire) which in turn may control the corresponding propulsion component of the propulsion system.

In some embodiments, the vehicle 10 includes a transmission in communication with a crankshaft via a flywheel or clutch or fluid coupling. In some embodiments, the transmission includes a manual transmission. In some embodiments, the transmission includes an automatic transmission. The vehicle 10 may include one or more pistons, in the case of an internal combustion engine or a hybrid vehicle, which cooperatively operate with the crankshaft to generate force which is translated through the transmission to one or more axles which turns wheels 22. When the vehicle 10 includes one or more electric motors, a vehicle battery and/or fuel cell provides energy to the electric motors to turn the wheels 22. In cases where the vehicle 10 includes a vehicle battery to provide energy to the one or more electric motors, when the battery is depleted, it may be connected to an electric grid (e.g., using a wall socket) to recharge the battery cells. Additionally, or alternatively, the vehicle 10 may employ regenerative braking which uses the one or more electric motors of the vehicle 10 as a generator to convert kinetic energy lost due to decelerating back into stored energy in the battery.

The vehicle 10 may include automatic vehicle propulsion systems, such as a cruise control, an adaptive cruise control, automatic braking control, other automatic vehicle propulsion systems, or a combination thereof. The vehicle 10 may be an autonomous or semi-autonomous vehicle, or other suitable type of vehicle. The vehicle 10 may include additional or fewer features than those generally illustrated and/or disclosed herein.

Figure 2:
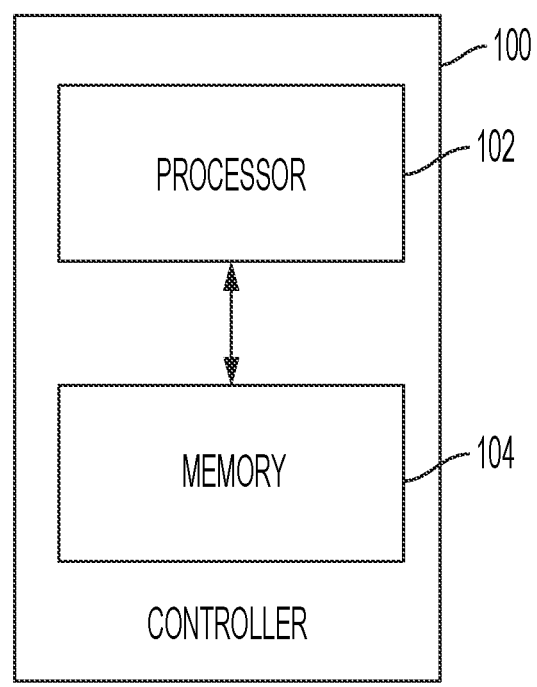
FIG. 2 generally illustrates a controller according to the principles of the present disclosure.

In some embodiments, the vehicle 10 may include a controller, such as controller 100, as is generally illustrated in FIG. 2. The controller 100 may include any suitable controller, such as an electronic control unit or other suitable controller. The controller 100 may be configured to control, for example, the various functions of the steering system and/or various functions of the vehicle 10. The controller 100 may include a processor 102 and a memory 104. The processor 102 may include any suitable processor, such as those described herein. Additionally, or alternatively, the controller 100 may include any suitable number of processors, in addition to or other than the processor 102. The memory 104 may comprise a single disk or a plurality of disks (e.g., hard drives), and includes a storage management module that manages one or more partitions within the memory 104. In some embodiments, memory 104 may include flash memory, semiconductor (solid state) memory or the like. The memory 104 may include Random Access Memory (RAM), a Read-Only Memory (ROM), or a combination thereof. The memory 104 may include instructions that, when executed by the processor 102, cause the processor 102 to, at least, control various aspects of the vehicle 10.

In some embodiments, the controller 100 may be configured to measure high voltage battery pack terminal voltages of the high voltage battery pack. The high voltage battery pack may include any suitable battery pack. The high voltage battery pack may be configured to provide electric power to one or more components of the vehicle 10, such as one or more propulsion components or other suitable components. Additionally, or alternatively, the high voltage battery pack may be associated with any suitable application other than the vehicle 10.

As is generally illustrated in FIGS. 4A-4C, a high voltage battery pack measurement system includes a first integrated circuit 402 and a second integrated circuit 404. The first integrated circuit 402 and the second integrated circuit 404 may include any suitable circuit or electronic component, such as those described herein.

The first integrated circuit 402 may receive an HVDC+ signal, a first reference voltage ($V_{M1}$), a second reference voltage, ($V_{M2}$), and a relatively low voltage signal ($V_{HS}$) (e.g., half of the HVDC+ signal or other suitable voltage). The second integrated circuit 404 may receive an HVDC− signal, a third reference voltage ($V_{M3}$), a fourth reference voltage, ($V_{M4}$), and a relatively voltage signal ($V_{HS}$) (e.g., half of the HVDC−). The first reference voltage, the second reference voltage, the third reference voltage, the relatively low voltage signal associated with the first integrated circuit 402, and the relatively low voltage signal associated with the second integrated circuit 404 may be generated using any suitable technique and may correspond to any suitable power supply, including, but not limited to, the high voltage battery pack.

The controller 100 may perform a calibration step. For example, a first analog-to-digital convertor (ADC1) may measure $V_{M1}$ and $V_{M2}$ and a second analog-to-digital converter (ADC2) may measure $V_{M3}$ and $V_{M4}$. This is accomplished by closing $\Phi_2$ and opening $\Phi_1$ switches. To measure $V_{M1}$ and $V_{M3}$, switches $\Phi_x$ and $\Phi_2$ are closed while the remaining switches are kept open. To measure $V_{M2}$ and $V_{M4}$, switches $\Phi_y$ and $\Phi_2$ are closed while the remaining switches are kept open. It should be understood that the exact absolute values and the stability of the generated reference voltages have no bearing on the accuracy of the high voltage battery pack measurement.

In some embodiments, four consecutive measurements are made by the ADC1 and the ADC2 while switches $\Phi_x$ and $\Phi_1$ are closed and the remaining switched are open. The equations describing these measurements may be described as:

$$V_{op1} = V_{M1} \cdot (1 + R_{x2}/R_{x1}) - HVDC+_1 \cdot R_{x2}/R_{x1}$$

$$V_{op2} = V_{M1} \cdot (1 + R_{x2}/R_{x1}) - HVDC+_2 \cdot R_{x2}/R_{x1}$$

$$V_{om1} = V_{M3} \cdot (1 + R_{x4}/R_{x3}) - HVDC-_1 \cdot R_{x4}/R_{x3}$$

$$V_{om2} = V_{M3} \cdot (1 + R_{x4}/R_{x3}) - HVDC-_2 \cdot R_{x4}/R_{x3}$$

In some embodiments, another four consecutive measurements are made by the ADC1 and the ADC2 while switches $\Phi_y$ and $\Phi_1$ are closed and the remaining switched are open. The equations describing these measurements may be described as:

$$V_{op3} = V_{M2} \cdot (1 + R_{x2}/R_{x1}) - HVDC+_3 \cdot R_{x2}/R_{x1}$$

$$V_{op4} = V_{M2} \cdot (1 + R_{x2}/R_{x1}) - HVDC+_4 \cdot R_{x2}/R_{x1}$$

$$V_{om3} = V_{M4} \cdot (1 + R_{x4}/R_{x3}) - HVDC-_3 \cdot Rx4/Rx3$$

$$V_{om4} = V_{M4} \cdot (1 + R_{x4}/R_{x3}) - HVDC-_4 \cdot R_{x4}/Rx3$$

The digital signal processing unit computes the following equations ($V_{outp1}$, $V_{outp2}$ and $\Delta V_{outp1}$, and the code for $\Delta V_{outp1}$ is stored in the memory, such as the memory 104, for subsequent computations:

$$V_{outp1}=(V_{op1}-V_{op3})=(1+R_{x2}/R_{x1})(V_{M1}-V_{M2})-(HVDC^+_1-HVDC^+_3)\cdot R_{x2}/R_{x1}$$

$$V_{outp2}=(V_{op4}-V_{op2})=(1+R_{x2}/R_{x1})(V_{M2}-V_{M1})-(HVDC^+_4-HVDC^{+2})\cdot R_{x2}/R_{x1}$$

$$\Delta V_{outp1}=(V_{outp1}-V_{outp2})/2=(1+R_{x2}/R_{x1})(V_{M1}-V_{M2})-[(HVDC^+_1-HVDC^+_2-HVDC^+_3+HVDC^+_4)/2]\cdot R_{x2}/R_{x1}$$

The above process is repeated for another four subsequent signal samples, and the following expression is further computed and the code for $\Delta V_{outp2}$ is also stored:

$$V_{outp3}=(Vop5-Vop7)=(1+R_{x2}/R_{x1})(V_{M1}-V_{M2})-(HVDC^+_5-HVDC^+_7)\cdot R_{x2}/R_{x1}$$

$$V_{outp4}=(Vop8-Vop6)=(1+R_{x2}/R_{x1})(V_{M2}-V_{M1})-(HVDC^+_8-HVDC^+_6)\cdot R/R_{x1}$$

$$\Delta V_{outp2}=V_{outp3}-V_{outp4})/2=(1+R_{x2}/R_{x1})(V_{M1}-V_{M2})-[(HVDC^+_5-HVDC^+_6-HVDC^+_7+HVDC^+_8)/2]\cdot R_{x2}/R_{x1}$$

After an additional four signal samples, the following expression is also computed and stored in memory:

$$\Delta V_{outp3}=(V_{outp5}-V_{outp6})/2=(1+R_{x2}/R_{x1})(V_{M1}-V_{M2})-[(HVDC^+_9-HVDC^+_{10}-HVDC^+_{11}+HVDC^+_{12})/2]\cdot R_{x2}/R_{x1}$$

Depending on the noise nature/statistics riding on the signals $HVDC^+_1$ through $HVDC^+_n$, a determined (e.g., by a user of the system 400) number of sets of sampled signals may be used, such that the following expression become accurate or substantially accurate:

$$HVDC^+_1-HVDC^+_2-HVDC^+_3+HVDC^+_4+HVDC^+_5-HVDC^+_6\quad HVDC+HVDC^+_8+HVDC^+_9-HVDC^+_{10}-HVDC+HVDC^+_{12}+\ldots+HVDC^+_{29}-HVDC^+_{30}-HVDC^+_{31}+HVDC^+_{32}\ +\ \ldots\ HVDC^+_{125}-HVDC^+_{126}-HVDC^+_{127}+HVDC^+_{128}\approx 0$$

In this example, 128 (4×32) samples are used, but it should be understood that any suitable number of iterative samples may be used, with each set of samples including four iterative measurements (e.g., which may allow the number of samples to be more or less than described herein).

In some embodiments, the controller 100 (e.g., which may be referred to herein as the digital signal processing unit) may computes the following output expression:

$$\Delta V_{outp}=(\Delta V_{outp1}+\Delta V_{outp2}+\Delta V_{outp3}\ldots \Delta V_{outp32})/32$$

It should be noted that other sequence signs of the sampled signals can also be used (e.g., or other sign sequences as long as the samples include two plus signs and two minus signs appearing in every four-sample summation), as shown below:

$$HVDC^+_1-HVDC^+_2+HVDC^+_3-HVDC^+_4+HVDC^+_5-HVDC^+_6+HVDC^+_7-HVDC^+_8+HVDC^+_9-HVDC^+_{10}+HVDC^+_{11}-HVDC^+_{12}+\ldots+HVDC^+_{29}-HVDC^+_{30}+HVDC^+_{31}-HVDC^+_{32}+\ldots HVDC^+_{125}-HVDC^+_{126}+HVDC^+_{127}-HVDC^+_{128}\approx 0$$

Assuming that the processing times of the $V_{op1}$ through $V_{opN}$ and $V_{om1}$ through $V_{omN}$ (where N=1 ... 32) signals, by the ADC1 and corresponding ones by the controller 100, are appreciably shorter than that the change in the $HVDC^+_1$ through $HVDC^+_{132}$ signals, then the following equations become accurate or substantially accurate:

$$HVDC^+_1-HVDC^+_2-HVDC^+_3+HVDC^+_4+\ldots +HVDC^+_{125}-HVDC^+_{126}-HVDC^+_{127}+HVDC^+_{128}=0,\text{ and therefore}$$

$$R_{x2}/R_{x1}=0.5*\Delta V/(V_{M1}-V_{M2})$$

Similarly, $$V_{outm1}=(Vom1-Vom3)=(1+R_{x4}/R_{x3})(V_{M3}-V_{M4})-(HVDC^-_1-HVDC^-_3)\cdot R_{x4}/R_{x3}$$

$$V_{outm2}=(Vom4-Vom2)=(1+R_{x4}/R_{x3})(V_{M4}-V_{M3})-(HVDC^-_4-HVDC^-_2)\cdot R_{x4}/R_{x3}$$

$$\Delta V_{outm1}=(V_{outm1}-V_{outm2})/2=(1+R_{x4}/R_{x3})(V_{M3}-V_{M4})-[(HVDC^+_1-HVDC^-_2-HVDC^-_3+HVDC^-_4)/2]\cdot R_{x4}/R_{x3}$$

$$V_{outm3}=(Vom5-Vom7)=(1+R_{x4}/R_{x3})(V_{M3}-V_{M4})-(HVDC^-_5-HVDC^-_7)\cdot R_{x4}/R_{x3}$$

$$V_{outm4}=(Vom8-Vom6)=(1+R_{x4}/R_{x3})(V_{M4}-V_{M3})-(HVDC^-_8-HVDC^-_6)\cdot R_{x4}/R_{x3}$$

$$\Delta V_{outm2}=(V_{outm3}-V_{outm4})/2=(1+R_{x4}/R_{x3})(V_{M3}-V_{M4})-[(HVDC^-_5-HVDC^-_6-HVDC^-_7+HVDC^-_8)/2]\cdot R_{x4}/R_{x3}$$

After measurement of another four subsequent signal samples, the following expression is computed and stored in memory for further use:

$$\Delta V_{outm3}=(V_{outm5}-V_{outm6})/2=(1+R_{x4}/R_{x3})(V_{M3}-V_{M4})-[(HVDC^-_9-HVDC^-_{10}-HVDC^-_{11}+HVDC^-_{12})/2]\cdot R_{x4}/R_{x3}$$

The controller 100 may compute the following output expression:

$$\Delta V_{outm}=(\Delta V_{outm1}+\Delta V_{outm2}+\Delta V_{outm3}\ldots \Delta V_{outm32})/32$$

Similarly, $$HVDC^-_1-HVDC^-_2-HVDC^-_3+HVDC^-_4+HVDC^-_5-HVDC^-_6-HVDC^-_7+HVDC^-_8+HVDC^-_9-HVDC^-_{10}-HVDC^-_{11}-HVDC^-_{12}+\ldots\ +\ HVDC^-_{29}-HVDC^-_{30}-HVDC^-_{31}+HVDC^-_{32}+\ldots HVDC^-_{125}-HVDC^-_{126}-HVDC^-_{127}+HVDC^-_{128}\approx 0$$

The controller 100 may then compute:

$$R_{x4}/R_{x3}=0.5*\Delta V_{outm}/(V_{M3}-V_{M4})$$

When the value of the resistors are determined such that the ratios of $R_{x1}/R_{x2}$ and $R_{x3}/R_{x4}$ are relatively large (e.g., greater than 50 or other suitable value), then controller 100 may amplify the signals $V_{op1}$ through $V_{opN}$ and $V_{om1}$ through $V_{omN}$ in order to preserve high signal processing accuracy.

As is generally illustrated in FIG. 4B, the expressions for the resistor ratios, which include a gain of "a" for corresponding amplifiers, are:

$$R_{x2}/R_{x1}=0.5*\Delta V_{outp}/[\alpha\cdot(V_{M1}-V_{M2})]$$

$$R_{x4}/R_{x3}=0.5*\Delta V_{outm}/[\alpha\cdot(V_{M3}-V_{M4})]$$

It should be noted that the high voltage battery pack voltage measurement system 400 is to be integrated into an integrated circuit device, which may include one of many integrated circuits manufactured at once in a batch processing.

In some embodiments, the resistors $R_{x2}$ and $R_{x4}$ may reside on the first integrated circuit 402 and each integrated circuit may be used in a unique system having its own particular values for the external $R_{x1}$ and $R_{x2}$ resistors. The terms "$V_{M1}-V_{M2}$", "$V_{M3}-V_{M4}$", and "a" introduce an error gain term, which may allow the dependency of $R_{x2}/R_{x1}$ and $R_{x4}/R_{x3}$ on "$V_{M1}-V_{M2}$", "$V_{M3}-V_{M4}$", and "$\alpha$" terms to be eliminated. This is achieved during the time of integrated circuit testing.

During the integrated circuit testing, this gain error term is measured and stored into the memory to be used when performing the high voltage battery pack measurement. The gain error term may be measured during the integrated circuit test to determine and store the values of $R_{x2}$ and $R_{x4}$ using precisely known values of external $R_{x1}$ and $R_{x2}$, which are connected during the integrated circuit testing. Furthermore, using the measured resistor ratios, normalized values for the resistor ratios are computed and stored into each integrated circuit to account and/or correct for the gain error term.

When the first integrated circuit 402 is used with certain $R_{x1}$ and $R_{x2}$ resistor values (e.g., with the range value of the external resistors, $R_{x1}$ and $R_{x2}$ may be determined such that the limited voltage dynamic range of the first integrated circuit 402 is carefully considered), during the system power-up period (e.g., or on a command) a determination of the calibration step may be performed. The calibration step uses the stored normalized resistor ratios from the memory to account for the gain error term to subsequently compute $R_{x2}/R_{x1}$ and $R_{x4}/R_{x3}$ values that are totally independent of any lump value of this gain error term. This may allow for the terms $\alpha \cdot (V_{M1}-V_{M2})$ and $\alpha \cdot (V_{M3}-V_{M4})$ to be accurately determined (e.g., since corresponding errors are accounted for each of the first integrated circuit 402 and the second integrated circuit 404) the above equations for $R_{x2}/R_{x1}$ and $R_{x4}/R_{x3}$ values are now free from any gain error.

After the completion of the calibration step, the controller 100 uses the computed resistor ratios to perform a high voltage battery pack voltage measurement step (e.g., which may result in precise measurements of the high voltage battery pack terminal voltages throughout the life of the system 400).

As is generally illustrated in FIG. 4C, the system 400 may be configured such that $V_{op}$ and $V_{om}$ are directly connected to the input of the ADC1 and the ADC2 in order to perform the battery voltage measurement. The controller 100 may achieve the measurement configuration by closing switches $\Phi_z$ and $\Phi_1$ (e.g., of FIG. 4A) while the other switches are left in an open state. The expressions for $V_{op}$ and $V_{om}$ during the measurement step are:

$$V_{op}=V_{HS}(1+R_{x2}/R_{x1})-HVDC_p \cdot R_{x2}/R_{x1}$$

$$V_{on}=V_{HS}(1+R_{x4}/R_{x3})-HVDC_m \cdot R_{x4}/R_{x3}$$

Assuming that $V_{HS}$ is already a known and/or measured quantity with high accuracy, then the first term in the equations for $V_{op}$ and $V_{om}$ is subtracted out. After rearranging the resultant equations, then the following equations are subsequently derived:

$$HVDC_p=[-V_{op}] \cdot R_{x1}/R_{x2}$$

$$HVDC_m=[-V_{om}] \cdot R_{x3}/R_{x4}$$

This illustrates that digital codes for $V_{op}$ and $V_{om}$, are output by the ADC1 and the ADC2, and these codes are further sent to the controller 100, which the controller 100 has previously computed the resistor ratios $R_{x1}/R_{x2}$ and $R_{x3}/R_{x4}$, from the calibration step, to further compute $HVDC_p$ and $HVDC_m$ and the difference of the high voltage battery pack terminal voltage values.

$$\Delta HVDC=HVDC_p-HVDC_m=V_{om} \cdot R_{x3}/R_{x4}-V_{op} \cdot R_{x1}/R_{x2}$$

In some embodiments, the system 400 may perform the methods described herein. However, the methods described herein as performed by the system 400 are not meant to be limiting, and any type of software executed on a controller or processor can perform the methods described herein without departing from the scope of this disclosure. For example, a controller, such as a processor executing software within a computing device, can perform the methods described herein.

Figure 5:
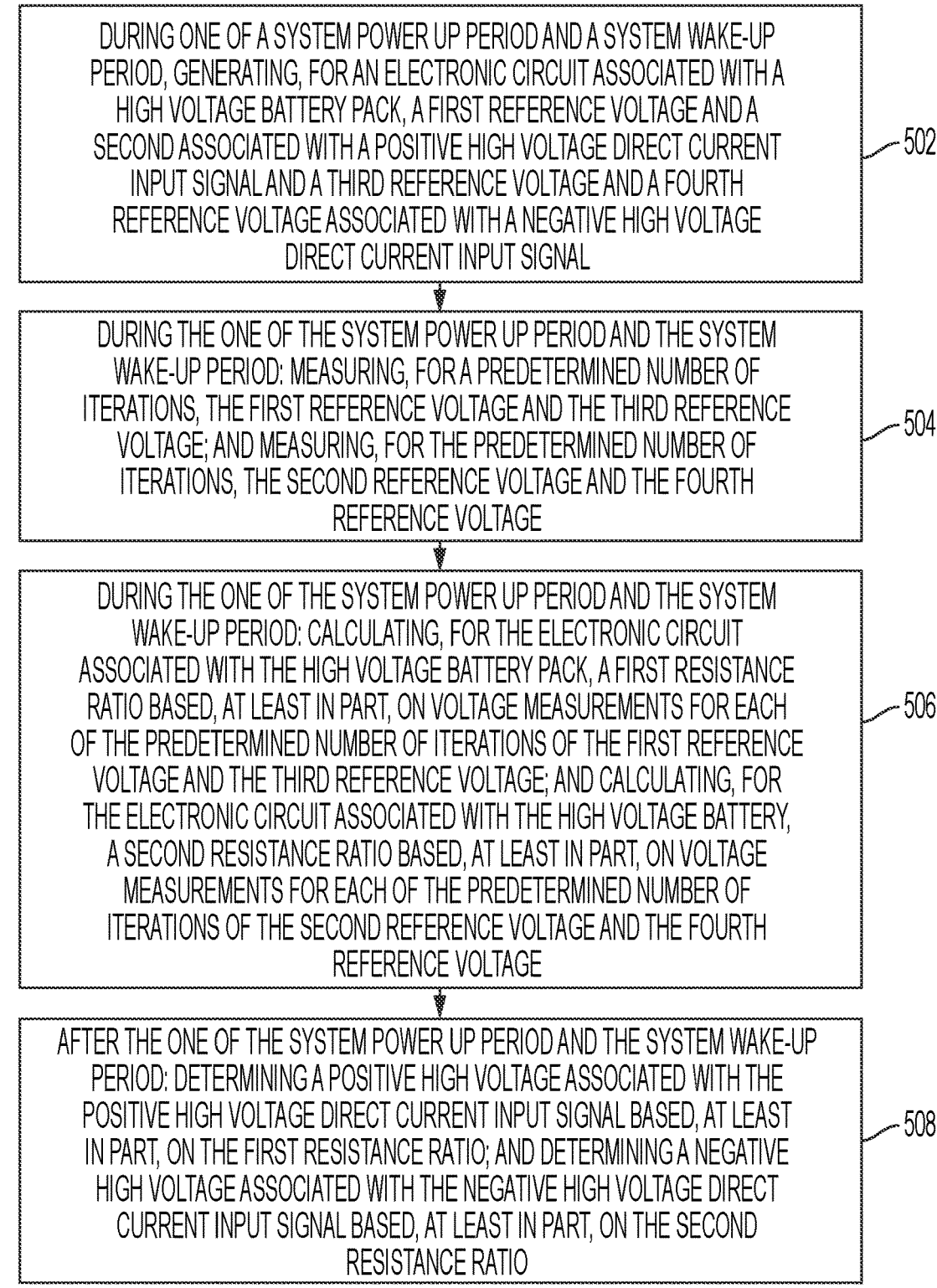
FIG. 5 is a flow diagram generally illustrating high voltage battery pack voltage measurement method according to the principles of the present disclosure.

FIG. 5 is a flow diagram generally illustrating a high voltage battery pack voltage measurement method 500 according to the principles of the present disclosure. At 502, the method 500, during one of a system power up period and a system wake-up period: generates, for an electronic circuit associated with the high voltage battery pack, a first reference voltage associated with a positive high voltage direct current input signal and a second reference voltage associated with the positive high voltage direct current input signal and a third reference voltage associated with a negative high voltage direct current input signal and a fourth reference voltage associated with the negative high voltage direct current input signal.

At 504, the method 500, during the one of the system power up period and the system wake-up period, measures, for a predetermined number of iterations, the first reference voltage and the third reference voltage. The method 500 also measures, for the predetermined number of iterations, the second reference voltage and the fourth reference voltage.

At 506, the method 500, during the one of the system power up period and the system wake-up period, calculates, for the electronic circuit associated with the high voltage battery pack, a first resistance ratio based, at least in part, on voltage measurements for each of the predetermined number of iterations of the first reference voltage and the third reference voltage. The method 500 also calculates, for the electronic circuit associated with the high voltage battery, a second resistance ratio based, at least in part, on voltage measurements for each of the predetermined number of iterations of the second reference voltage and the fourth reference voltage.

At 508, the method 500, after the one of the system power up period and the system wake-up period, determines a positive high voltage associated with the positive high voltage direct current input signal based, at least in part, on the first resistance ratio. The method 500 also determines a negative high voltage associated with the negative high voltage direct current input signal based, at least in part, on the second resistance ratio.

Clause 1. A method for measuring voltage of a high voltage battery pack, the method comprising: during one of a system power up period and a system wake-up period: generating, for an electronic circuit associated with the high voltage battery pack, a first reference voltage associated with a positive high voltage direct current input signal and a second reference voltage associated with the positive high voltage direct current input signal and a third reference voltage associated with a negative high voltage direct current input signal and a fourth reference voltage associated with the negative high voltage direct current input signal; measuring, for a predetermined number of iterations, the first reference voltage and the third reference voltage; measuring, for the predetermined number of iterations, the second reference voltage and the fourth reference voltage; calculating, for the electronic circuit associated with the high voltage battery pack, a first resistance ratio based, at least in part, on voltage measurements for each of the predetermined number of iterations of the first reference voltage and the third reference voltage; and calculating, for the electronic circuit associated with the high voltage battery, a second resistance ratio based, at least in part, on voltage measurements for each of the predetermined number of iterations of the second reference voltage and the fourth reference voltage; and after the one of the system power up period and the system wake-up period: determining a positive high voltage associated with the positive high voltage direct current input signal based, at least in part, on the first resistance ratio; and determining a negative high voltage associated with the negative high voltage direct current input signal based, at least in part, on the second resistance ratio.

Clause 2. The method of clause 1, wherein: measuring, for the predetermined number of iterations, the first reference voltage includes closing a switch corresponding to the positive high voltage direct current input signal and a switch corresponding to the first reference voltage; and measuring, for the predetermined number of iterations, the third reference voltage includes closing a switch corresponding to the negative high voltage direct current input signal and a switch corresponding to the third reference voltage.

Clause 3. The method of clause 1, wherein: measuring, for the predetermined number of iterations, the second reference voltage includes closing a switch corresponding to the positive high voltage direct current input signal and a switch corresponding to the second reference voltage; and measuring, for the predetermined number of iterations, the fourth reference voltage includes closing a switch corresponding to the negative high voltage direct current input signal and a switch corresponding to the fourth reference voltage.

Clause 4. The method of clause 1, wherein the first resistance ratio includes a ratio of a resistance of a first integrated circuit of the electronic circuit associated with the high voltage battery pack and an external resistance of the first integrated circuit.

Clause 5. The method of clause 1, wherein the second resistance ratio includes a ratio of a resistance of a second integrated circuit of the electronic circuit associated with the high voltage battery pack and an external resistance of the second integrated circuit.

Clause 6. The method of clause 1, wherein: determining the positive high voltage associated with the positive high voltage direct current input signal includes closing a switch corresponding to the positive high voltage direct current input signal and a switch corresponding to a low voltage signal reference voltage associated with the positive high voltage direct current input signal; and determining the negative high voltage associated with the negative high voltage direct current input signal includes closing a switch corresponding to the negative high voltage direct current input signal and a switch corresponding to a low voltage signal reference voltage associated with the negative high voltage direct current input signal.

Clause 7. The method of clause 1, wherein the predetermined number of iterations includes four iterations.

Clause 8. The method of clause 1, wherein the high voltage battery pack is associated with a vehicle.

Clause 9. A system for measuring voltage of a high voltage battery pack, the system comprising: a first integrated circuit configured to receive a first reference voltage and a second reference voltage associated with a positive high voltage direct current input signal; a second integrated circuit configured to receive a third reference voltage and a fourth reference voltage associated with a negative high voltage direct current input signal; a first analog-to-digital converter in communication with the first integrated circuit, the first analog-to-digital converter being configured to measure, during one of a system power up period and a system wake-up period, the first reference voltage and the third reference voltage for a predetermined number of iterations; and a second analog-to-digital converter in communication with the second integrated circuit, the second analog-to-digital converter being configured to measure, during the one of the system power up period and the system wake-up period, the second reference voltage and the fourth reference voltage for the predetermined number of iterations. The system may also include a controller configured to calculate a first resistance ratio based, at least in part, on voltage measurements for each of the predetermined number of iterations of the first reference voltage and the third reference voltage, and, after the one of the system power up period and the system wake-up period, determine a positive high voltage associated with the positive high voltage direct current input signal based, at least in part, on the first resistance ratio. The controller may calculate a second resistance ratio based, at least in part, on voltage measurements for each of the predetermined number of iterations of the second reference voltage and the fourth reference voltage, and after the one of the system power up period and the system wake-up period, determine a negative high voltage associated with the negative high voltage direct current input signal based, at least in part, on the second resistance ratio.

Clause 10. The system of clause 9, wherein: measuring, for the predetermined number of iterations, the first reference voltage includes closing a switch corresponding to the positive high voltage direct current input signal and a switch corresponding to the first reference voltage; and measuring, for the predetermined number of iterations, the third reference voltage includes closing a switch corresponding to the negative high voltage direct current input signal and a switch corresponding to the third reference voltage.

Clause 11. The system of clause 9, wherein: measuring, for the predetermined number of iterations, the second reference voltage includes closing a switch corresponding to the positive high voltage direct current input signal and a switch corresponding to the second reference voltage; and measuring, for the predetermined number of iterations, the fourth reference voltage includes closing a switch corresponding to the negative high voltage direct current input signal and a switch corresponding to the fourth reference voltage.

Clause 12. The system of clause 9, wherein the first resistance ratio includes a ratio of a resistance of the first integrated circuit and an external resistance of the first integrated circuit.

Clause 13. The system of clause 9, wherein the second resistance ratio includes a ratio of a resistance of the second integrated circuit and an external resistance of the second integrated circuit.

Clause 14. The system of clause 9, wherein: determining the positive high voltage associated with the positive high voltage direct current input signal includes closing a switch corresponding to the positive high voltage direct current input signal and a switch corresponding to a low voltage signal reference voltage associated with the positive high voltage direct current input signal; and determining the negative high voltage associated with the negative high voltage direct current input signal includes closing a switch corresponding to the negative high voltage direct current input signal and a switch corresponding to a low voltage signal reference voltage associated with the negative high voltage direct current input signal.

Clause 15. The system of clause 9, wherein the predetermined number of iterations includes four iterations.

Clause 16. The system of clause 9, wherein the high voltage battery pack is associated with a vehicle.

Clause 17. An apparatus for measuring voltage of a high voltage battery pack, the apparatus comprising: a first analog-to-digital converter configured to measure, for a predetermined number of iterations, a first reference voltage associated with a positive high voltage direct current input signal and a third reference voltage associated with a negative high voltage direct current input signal; and a second analog-to-digital converter configured to measure, for the predetermined number of iterations, a second reference voltage associated with the positive high voltage direct current input signal and a fourth reference voltage associated with the negative high voltage direct current input signal; a controller configured to: calculate a first resistance ratio based, at least in part, on voltage measurements for each of the predetermined number of iterations of the first reference voltage and the third reference voltage; and determine a positive high voltage associated with the positive high voltage direct current input signal based, at least in part, on the first resistance ratio; calculate a second resistance ratio based, at least in part, on voltage measurements for each of the predetermined number of iterations of the second reference voltage and the fourth reference voltage; and determine a negative high voltage associated with the negative high voltage direct current input signal based, at least in part, on the second resistance ratio.

Clause 18. The apparatus of clause 17, wherein: measuring, for the predetermined number of iterations, the first reference voltage includes closing a switch corresponding to the positive high voltage direct current input signal and a switch corresponding to the first reference voltage; and measuring, for the predetermined number of iterations, the third reference voltage includes closing a switch corresponding to the negative high voltage direct current input signal and a switch corresponding to the third reference voltage.

Clause 19. The apparatus of clause 17, wherein: measuring, for the predetermined number of iterations, the second reference voltage includes closing a switch corresponding to the positive high voltage direct current input signal and a switch corresponding to the second reference voltage; and measuring, for the predetermined number of iterations, the fourth reference voltage includes closing a switch corresponding to the negative high voltage direct current input signal and a switch corresponding to the fourth reference voltage.

Clause 20. The apparatus of clause 17, wherein: determining the positive high voltage associated with the positive high voltage direct current input signal includes closing a switch corresponding to the positive high voltage direct current input signal and a switch corresponding to a low voltage signal reference voltage associated with the positive high voltage direct current input signal; and determining the negative high voltage associated with the negative high voltage direct current input signal includes closing a switch corresponding to the negative high voltage direct current input signal and a switch corresponding to a low voltage signal reference voltage associated with the negative high voltage direct current input signal.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

The word "example" is used herein to mean serving as an example, instance, or illustration. Any aspect or design described herein as "example" is not necessarily to be construed as preferred or advantageous over other aspects or designs. Rather, use of the word "example" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an implementation" or "one implementation" throughout is not intended to mean the same embodiment or implementation unless described as such.

Implementations of the systems, algorithms, methods, instructions, etc., described herein can be realized in hardware, software, or any combination thereof. The hardware can include, for example, computers, intellectual property (IP) cores, application-specific integrated circuits (ASICs), programmable logic arrays, optical processors, programmable logic controllers, microcode, microcontrollers, servers, microprocessors, digital signal processors, or any other suitable circuit. In the claims, the term "processor" should be understood as encompassing any of the foregoing hardware, either singly or in combination. The terms "signal" and "data" are used interchangeably.

As used herein, the term module can include a packaged functional hardware unit designed for use with other components, a set of instructions executable by a controller (e.g., a processor executing software or firmware), processing circuitry configured to perform a particular function, and a self-contained hardware or software component that interfaces with a larger system. For example, a module can include an application specific integrated circuit (ASIC), a Field Programmable Gate Array (FPGA), a circuit, digital logic circuit, an analog circuit, a combination of discrete circuits, gates, and other types of hardware or combination thereof. In other embodiments, a module can include memory that stores instructions executable by a controller to implement a feature of the module.

Further, in one aspect, for example, systems described herein can be implemented using a general-purpose computer or general-purpose processor with a computer program that, when executed, carries out any of the respective methods, algorithms, and/or instructions described herein. In addition, or alternatively, for example, a special purpose computer/processor can be utilized which can contain other hardware for carrying out any of the methods, algorithms, or instructions described herein.

Further, all or a portion of implementations of the present disclosure can take the form of a computer program product accessible from, for example, a computer-usable or computer-readable medium. A computer-usable or computer-readable medium can be any device that can, for example, tangibly contain, store, communicate, or transport the program for use by or in connection with any processor. The medium can be, for example, an electronic, magnetic, optical, electromagnetic, or a semiconductor device. Other suitable mediums are also available.

The above-described embodiments, implementations, and aspects have been described in order to allow easy understanding of the present disclosure and do not limit the present disclosure. On the contrary, the disclosure is intended to cover various modifications and equivalent arrangements included within the scope of the appended claims, which scope is to be accorded the broadest interpretation to encompass all such modifications and equivalent structure as is permitted under the law.

What is claimed is:

1. A method for measuring voltage of a high voltage battery pack, the method comprising:
during one of a system power up period and a system wake-up period:
generating, for an electronic circuit associated with the high voltage battery pack, a first reference voltage associated with a positive high voltage direct current input signal and a second reference voltage associated with the positive high voltage direct current input signal and a third reference voltage associated with a negative high voltage direct current input signal and a fourth reference voltage associated with the negative high voltage direct current input signal;
measuring, for a predetermined number of iterations, the first reference voltage and the third reference voltage;
measuring, for the predetermined number of iterations, the second reference voltage and the fourth reference voltage;
calculating, for the electronic circuit associated with the high voltage battery pack, a first resistance ratio based, at least in part, on voltage measurements for each of the predetermined number of iterations of the first reference voltage and the third reference voltage; and
calculating, for the electronic circuit associated with the high voltage battery, a second resistance ratio based, at least in part, on voltage measurements for each of the predetermined number of iterations of the second reference voltage and the fourth reference voltage; and
after the one of the system power up period and the system wake-up period:
determining a positive high voltage associated with the positive high voltage direct current input signal based, at least in part, on the first resistance ratio; and
determining a negative high voltage associated with the negative high voltage direct current input signal based, at least in part, on the second resistance ratio.

2. The method of claim 1, wherein:
measuring, for the predetermined number of iterations, the first reference voltage includes closing a switch corresponding to the positive high voltage direct current input signal and a switch corresponding to the first reference voltage; and
measuring, for the predetermined number of iterations, the third reference voltage includes closing a switch corresponding to the negative high voltage direct current input signal and a switch corresponding to the third reference voltage.

3. The method of claim 1, wherein:
measuring, for the predetermined number of iterations, the second reference voltage includes closing a switch corresponding to the positive high voltage direct current input signal and a switch corresponding to the second reference voltage; and
measuring, for the predetermined number of iterations, the fourth reference voltage includes closing a switch corresponding to the negative high voltage direct current input signal and a switch corresponding to the fourth reference voltage.

4. The method of claim 1, wherein the first resistance ratio includes a ratio of a resistance of a first integrated circuit of the electronic circuit associated with the high voltage battery pack and an external resistance of the first integrated circuit.

5. The method of claim 1, wherein the second resistance ratio includes a ratio of a resistance of a second integrated circuit of the electronic circuit associated with the high voltage battery pack and an external resistance of the second integrated circuit.

6. The method of claim 1, wherein:
determining the positive high voltage associated with the positive high voltage direct current input signal includes closing a switch corresponding to the positive high voltage direct current input signal and a switch corresponding to a low voltage signal reference voltage associated with the positive high voltage direct current input signal; and
determining the negative high voltage associated with the negative high voltage direct current input signal includes closing a switch corresponding to the negative high voltage direct current input signal and a switch corresponding to a low voltage signal reference voltage associated with the negative high voltage direct current input signal.

7. The method of claim 1, wherein the predetermined number of iterations includes four iterations.

8. The method of claim 1, wherein the high voltage battery pack is associated with a vehicle.

9. A system for measuring voltage of a high voltage battery pack, the system comprising:
a first integrated circuit configured to receive a first reference voltage and a second reference voltage associated with a positive high voltage direct current input signal;
a second integrated circuit configured to receive a third reference voltage and a fourth reference voltage associated with a negative high voltage direct current input signal;
a first analog-to-digital converter in communication with the first integrated circuit, the first analog-to-digital converter being configured to measure, during one of a system power up period and a system wake-up period, the first reference voltage and the third reference voltage for a predetermined number of iterations;
a second analog-to-digital converter in communication with the second integrated circuit, the second analog-to-digital converter being configured to measure, during the one of the system power up period and the system wake-up period, the second reference voltage and the fourth reference voltage for the predetermined number of iterations; and
a controller configured to:
calculate a first resistance ratio based, at least in part, on voltage measurements for each of the predetermined number of iterations of the first reference voltage and the third reference voltage;
calculate a second resistance ratio based, at least in part, on voltage measurements for each of the predetermined number of iterations of the second reference voltage and the fourth reference voltage;
after the one of the system power up period and the system wake-up period, determine a positive high voltage associated with the positive high voltage direct current input signal based, at least in part, on the first resistance ratio; and
after the one of the system power up period and the system wake-up period, determine a negative high voltage associated with the negative high voltage direct current input signal based, at least in part, on the second resistance ratio.

10. The system of claim 9, wherein:
measuring, for the predetermined number of iterations, the first reference voltage includes closing a switch corresponding to the positive high voltage direct current input signal and a switch corresponding to the first reference voltage; and
measuring, for the predetermined number of iterations, the third reference voltage includes closing a switch corresponding to the negative high voltage direct current input signal and a switch corresponding to the third reference voltage.

11. The system of claim 9, wherein:
measuring, for the predetermined number of iterations, the second reference voltage includes closing a switch corresponding to the positive high voltage direct current input signal and a switch corresponding to the second reference voltage; and
measuring, for the predetermined number of iterations, the fourth reference voltage includes closing a switch corresponding to the negative high voltage direct current input signal and a switch corresponding to the fourth reference voltage.

12. The system of claim 9, wherein the first resistance ratio includes a ratio of a resistance of the first integrated circuit and an external resistance of the first integrated circuit.

13. The system of claim 9, wherein the second resistance ratio includes a ratio of a resistance of the second integrated circuit and an external resistance of the second integrated circuit.

14. The system of claim 9, wherein:
determining the positive high voltage associated with the positive high voltage direct current input signal includes closing a switch corresponding to the positive high voltage direct current input signal and a switch corresponding to a low voltage signal reference voltage associated with the positive high voltage direct current input signal; and
determining the negative high voltage associated with the negative high voltage direct current input signal includes closing a switch corresponding to the negative high voltage direct current input signal and a switch corresponding to a low voltage signal reference voltage associated with the negative high voltage direct current input signal.

15. The system of claim 9, wherein the predetermined number of iterations includes four iterations.

16. The system of claim 9, wherein the high voltage battery pack is associated with a vehicle.

17. An apparatus for measuring voltage of a high voltage battery pack, the apparatus comprising:
a first analog-to-digital converter configured to measure, for a predetermined number of iterations, a first reference voltage associated with a positive high voltage direct current input signal and a third reference voltage associated with a negative high voltage direct current input signal; and
a second analog-to-digital converter configured to measure, for the predetermined number of iterations, a second reference voltage associated with the positive high voltage direct current input signal and a fourth reference voltage associated with the negative high voltage direct current input signal;

a controller configured to:
calculate a first resistance ratio based, at least in part, on voltage measurements for each of the predetermined number of iterations of the first reference voltage and the third reference voltage;
calculate a second resistance ratio based, at least in part, on voltage measurements for each of the predetermined number of iterations of the second reference voltage and the fourth reference voltage;
determine a positive high voltage associated with the positive high voltage direct current input signal based, at least in part, on the first resistance ratio; and
determine a negative high voltage associated with the negative high voltage direct current input signal based, at least in part, on the second resistance ratio.

18. The apparatus of claim 17, wherein:
measuring, for the predetermined number of iterations, the first reference voltage includes closing a switch corresponding to the positive high voltage direct current input signal and a switch corresponding to the first reference voltage; and
measuring, for the predetermined number of iterations, the third reference voltage includes closing a switch corresponding to the negative high voltage direct current input signal and a switch corresponding to the third reference voltage.

19. The apparatus of claim 17, wherein:
measuring, for the predetermined number of iterations, the second reference voltage includes closing a switch corresponding to the positive high voltage direct current input signal and a switch corresponding to the second reference voltage; and
measuring, for the predetermined number of iterations, the fourth reference voltage includes closing a switch corresponding to the negative high voltage direct current input signal and a switch corresponding to the fourth reference voltage.

20. The apparatus of claim 17, wherein:
determining the positive high voltage associated with the positive high voltage direct current input signal includes closing a switch corresponding to the positive high voltage direct current input signal and a switch corresponding to a low voltage signal reference voltage associated with the positive high voltage direct current input signal; and
determining the negative high voltage associated with the negative high voltage direct current input signal includes closing a switch corresponding to the negative high voltage direct current input signal and a switch corresponding to a low voltage signal reference voltage associated with the negative high voltage direct current input signal.

* * * * *